United States Patent
Lu et al.

(10) Patent No.: US 11,768,989 B2
(45) Date of Patent: Sep. 26, 2023

(54) REDUCED AREA STANDARD CELL ABUTMENT CONFIGURATIONS

(71) Applicant: TAIWAN SEMICONDUCTOR MANUFACTURING COMPANY, LTD., Hsinchu (TW)

(72) Inventors: Chi-Yu Lu, Hsinchu (TW); Hui-Zhong Zhuang, Hsinchu (TW); Pin-Dai Sue, Hsinchu (TW); Yi-Hsin Ko, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/558,157

(22) Filed: Dec. 21, 2021

(65) Prior Publication Data

US 2022/0114322 A1    Apr. 14, 2022

Related U.S. Application Data

(63) Continuation of application No. 16/664,242, filed on Oct. 25, 2019, now Pat. No. 11,216,608.

(60) Provisional application No. 62/753,678, filed on Oct. 31, 2018.

(51) Int. Cl.
*G06F 30/392* (2020.01)
*G06F 30/398* (2020.01)

(52) U.S. Cl.
CPC ......... *G06F 30/392* (2020.01); *G06F 30/398* (2020.01)

(58) Field of Classification Search
CPC ............................ G06F 30/392; G06F 30/398
USPC ....................................................... 257/618
See application file for complete search history.

(56) References Cited

U.S. PATENT DOCUMENTS

| 7,260,442 | B2 | 8/2007 | Hwang et al. |
| 8,533,639 | B2 | 9/2013 | Lin |
| 9,256,709 | B2 | 2/2016 | Yu et al. |
| 10,970,451 | B2 * | 4/2021 | Li ..................... H01L 27/0924 |
| 2014/0040838 | A1 | 2/2014 | Liu et al. |
| 2015/0278429 | A1 | 10/2015 | Chang |

* cited by examiner

*Primary Examiner* — Tu-Tu V Ho
(74) *Attorney, Agent, or Firm* — Hauptman Ham, LLP

(57) ABSTRACT

A method of designing a semiconductor device including the operations of analyzing a vertical abutment between a first standard cell block and a second cell block and, if a mismatch is identified between the first standard cell block and the second cell block initiating the selection of a first modified cell block that reduces the mismatch and a spacing between the first modified cell block and the second cell block, the first modified cell block comprising a first abutment region having a continuous active region arranged along a first axis parallel to an edge of the vertical abutment, and replacing the first standard cell block with the first modified cell block to obtain a first modified layout design and devices manufactured according to the method.

20 Claims, 15 Drawing Sheets

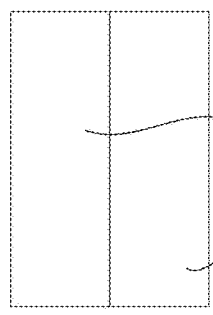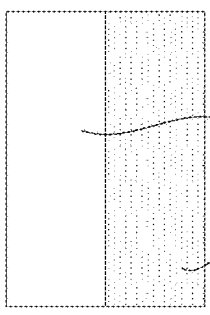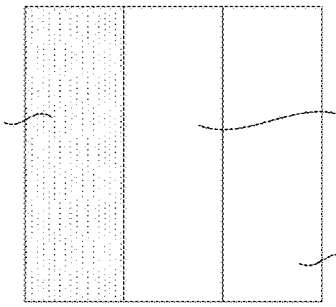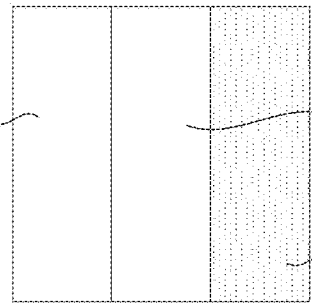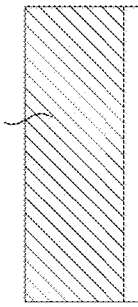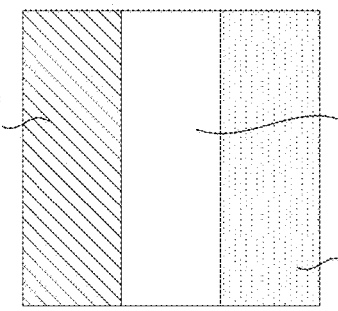

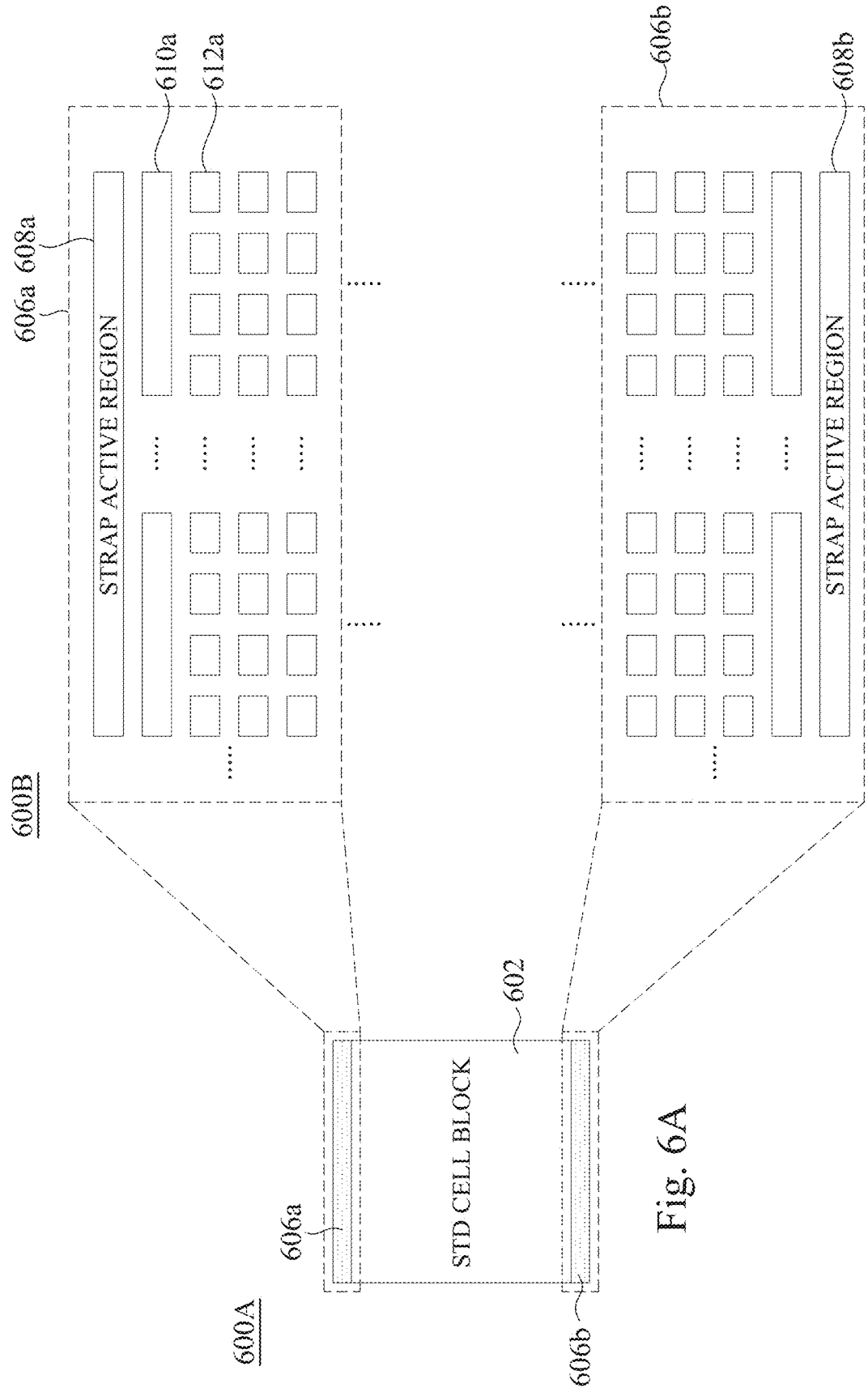

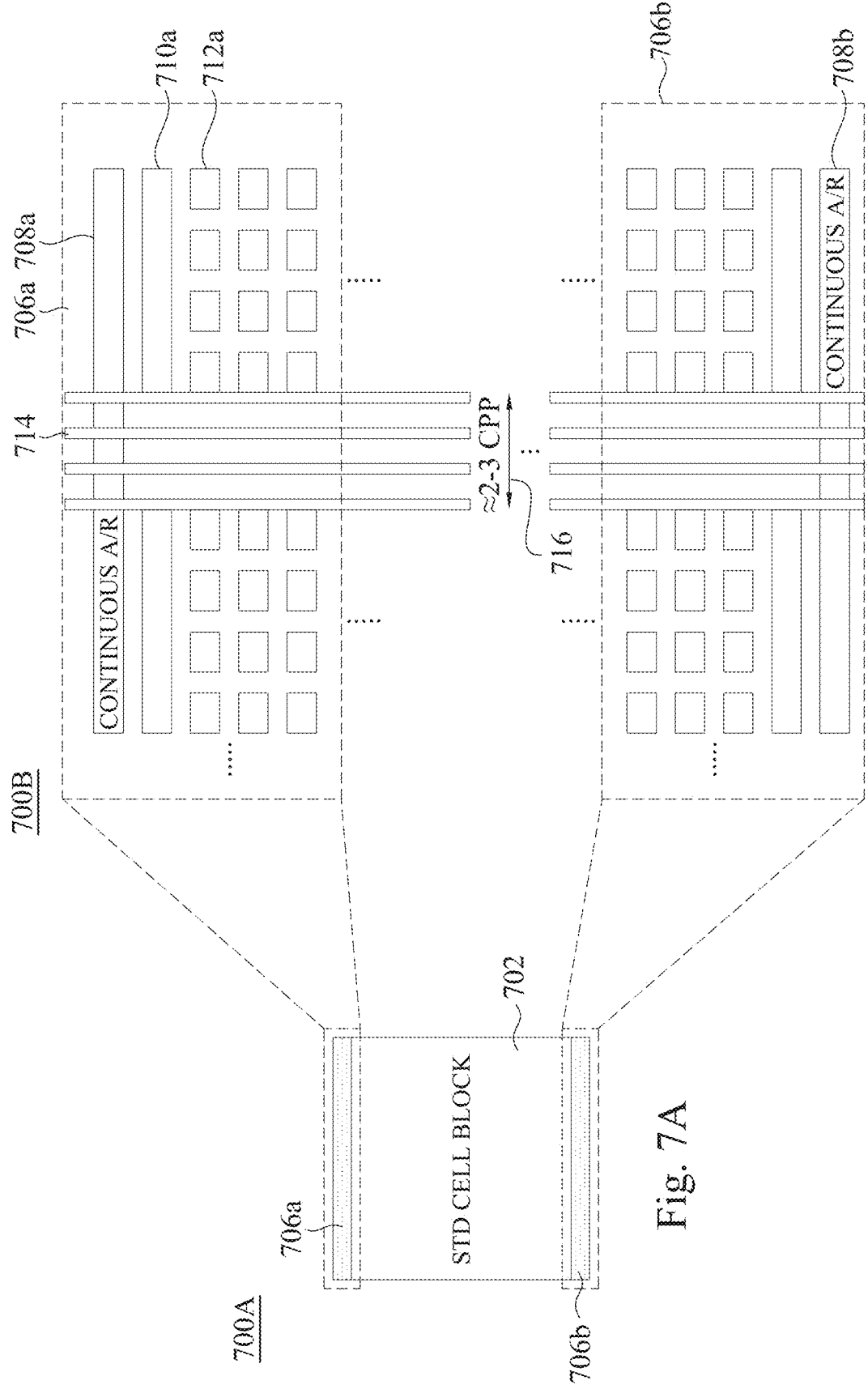

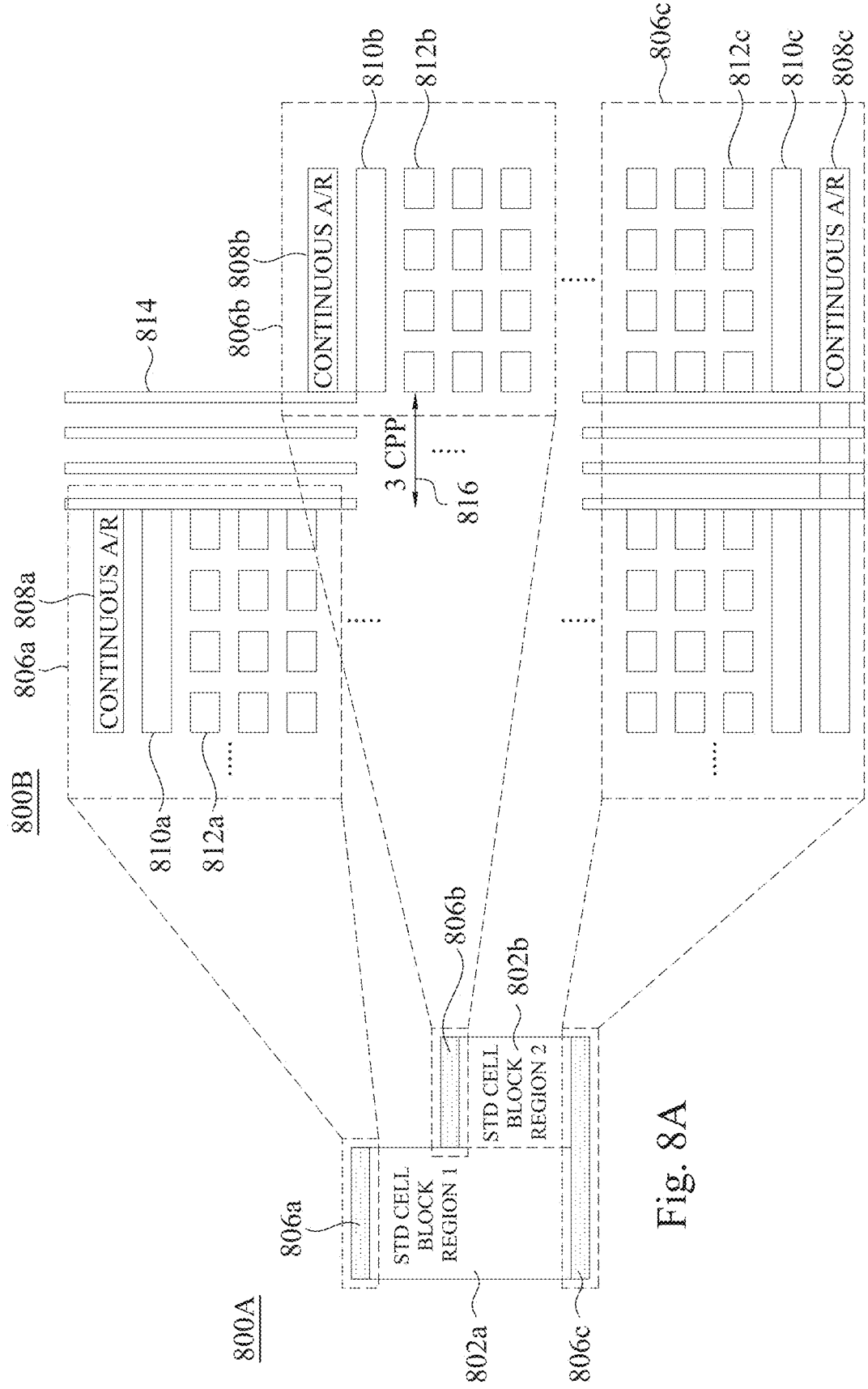

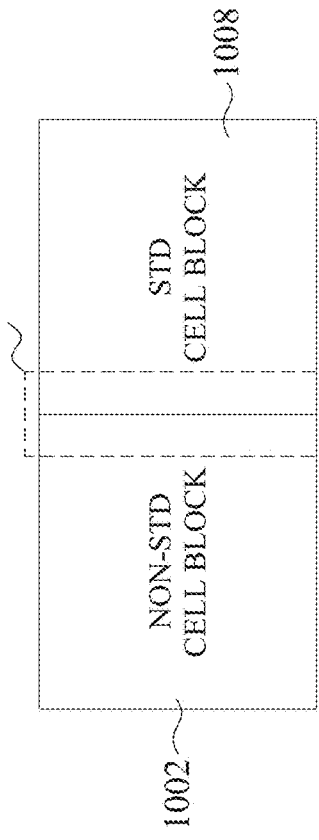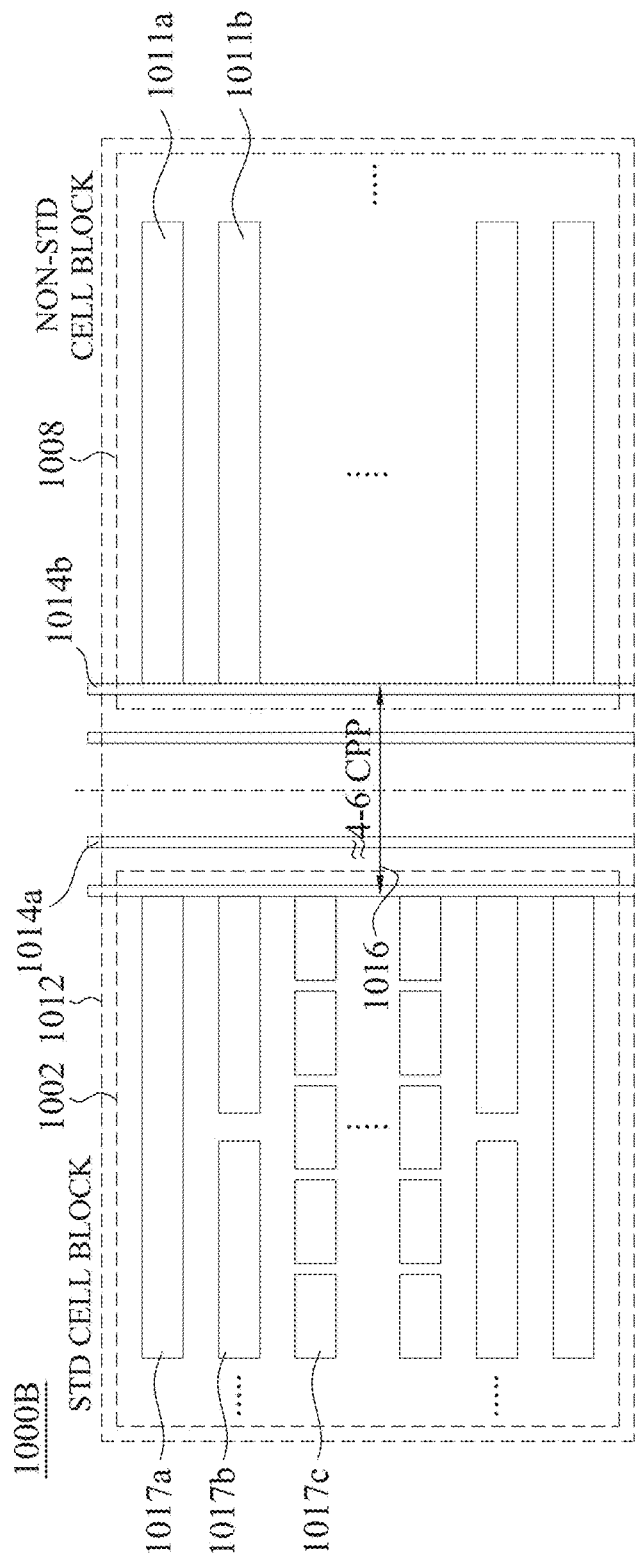

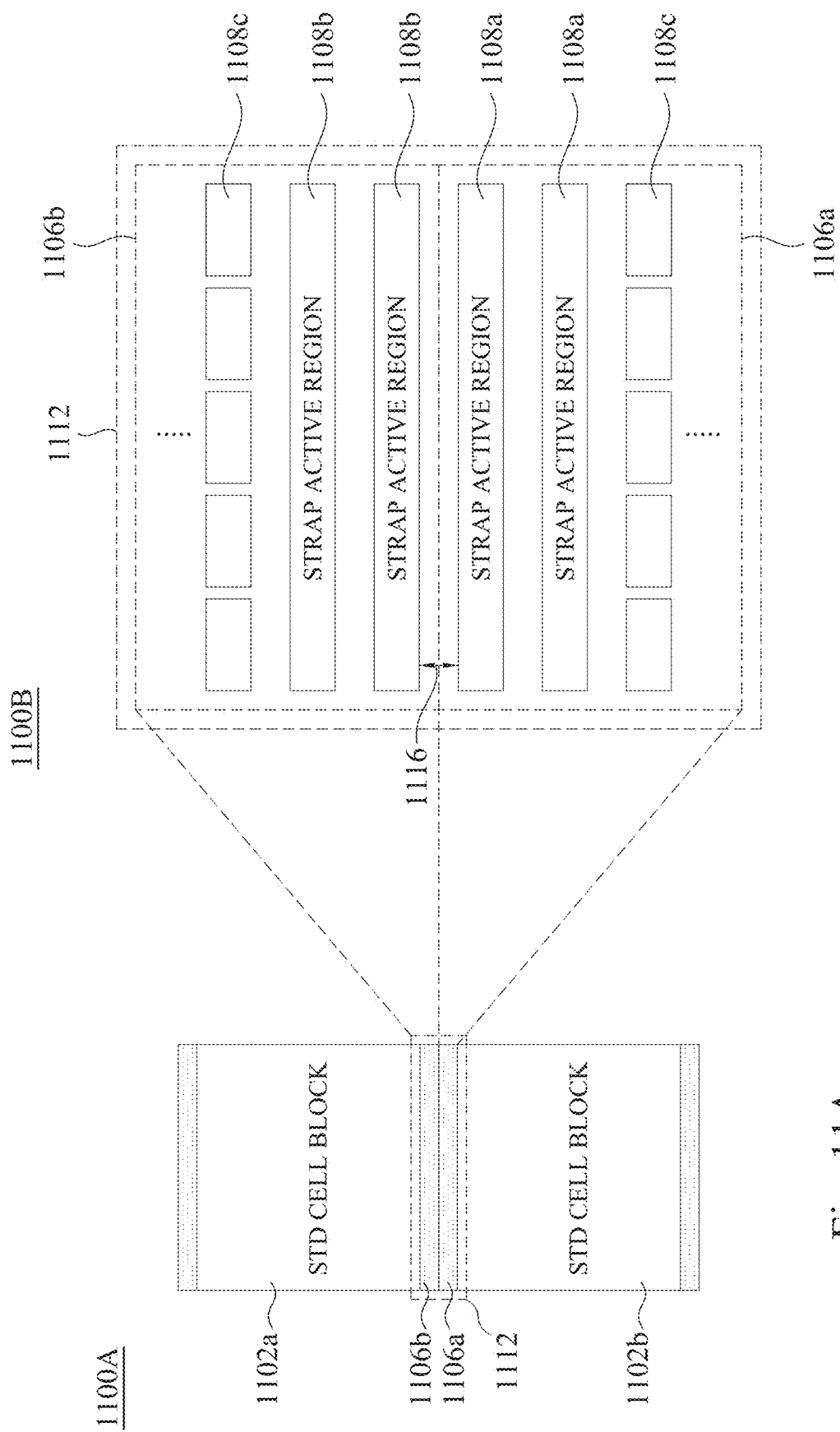

US 11,768,989 B2

REDUCED AREA STANDARD CELL ABUTMENT CONFIGURATIONS

PRIORITY CLAIM

This application is a continuation of U.S. patent application Ser. No. 16/664,242, filed on Oct. 25, 2019, which claims the benefit of U.S. Provisional Application No. 62/753,678, filed on Oct. 31, 2018, the entirety of which is incorporated by reference herein.

BACKGROUND

The semiconductor integrated circuit (IC) industry has continued to experience rapid growth with technological advances in IC materials and design producing successive generations of ICs, each new generation having smaller geometries and more complex circuits than the previous generation. The complexity of the associated layout, device structures, and manufacturing processes for producing each new generation of ICs has increased correspondingly in order to provide the designed functional density.

The performance of advanced patterning and etching processes are affected by density gradient effects (DGE) associated with the particular IC device layout configuration being manufactured. Consideration and adjustment of the relative placement, height, and density of the functional and non-functional structures during IC device layout mitigate some of the DGE and improve the uniformity and performance of the resulting ICs and allow for reductions in chip area and increases in chip density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are cross-sectional views of various N-type boundary configurations according to some embodiments.

FIGS. 4A-4C are cross-sectional views of various P-type boundary configurations according to some embodiments.

FIG. 6A is a plan view of an embodiment of a standard cell block with modified top and bottom regions and FIG. 6B is an enlarged plan view of the standard cell block structure.

FIG. 7A is a plan view of an embodiment of a standard cell block with modified top and bottom regions and FIG. 7B is an enlarged plan view of the standard cell block structure.

FIG. 8A is a plan view of an embodiment of a standard cell block with modified top and bottom regions and FIG. 8B is an enlarged plan view of the standard cell block structure.

FIG. 10A is a plan view of an embodiment of a standard cell block with modified top and bottom regions horizontally abutting a non-standard cell block and FIG. 10B is an enlarged plan view of the abutting structures.

FIG. 11A is a plan view of an embodiment of a first standard cell block with modified top and bottom regions vertically abutting a second standard cell block and FIG. 11B is an enlarged plan view of the abutting structures.

DETAILED DESCRIPTION

Figure 1:
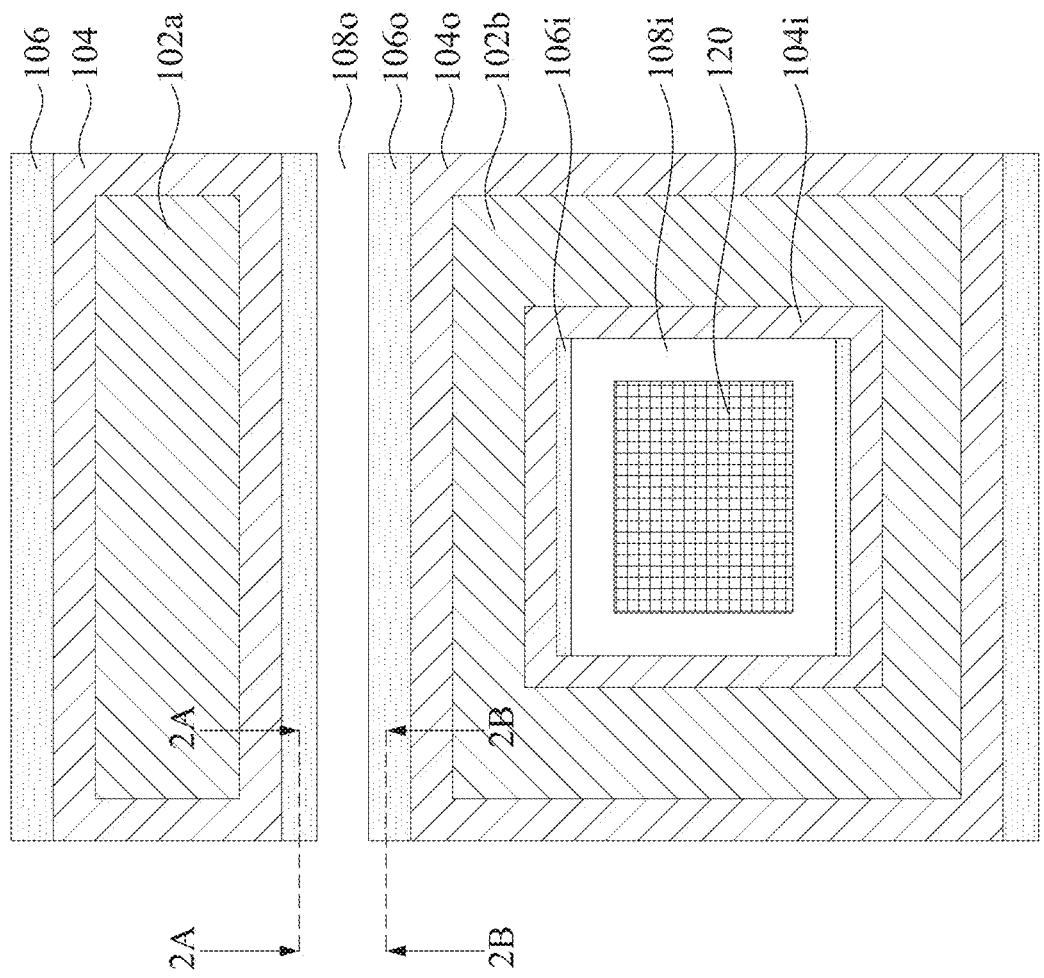
FIG. 1 is a plan view of an initial integrated circuit layout including two standard cell block regions.

This description of the exemplary embodiments is intended to be read in connection with the accompanying drawings, which are to be considered part of the entire written description. The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Modifying the structure of the boundary regions of standard cells in accordance with some embodiments will tend to reduce density gradient effects (DGE) and improve yield, process performance, and layout operations. In accordance with some embodiments, the boundary regions of standard cells are designed to incorporate and/or compensate for the various types of active regional abutment variations found between two adjacent active areas on IC layout designs. Incorporating standard cells having modified boundary regions according to some embodiments helps to improve a transition between adjacent active regions (AR) while decreasing the use of open area (white space) and/or transition or dummy cells between active regions. This helps to reduce the overall size of devices including the standard cells having modified boundary regions.

FIG. 1 is a plan view of an initial integrated circuit layout including two standard cell blocks 102a, 102b. The upper standard cell block 102a includes a peripheral boundary region 104 and upper and lower abutment regions 106. The upper standard cell block 102a is separated from the lower standard cell block 102b by non-functional space or "white" space 108o. In some embodiments, the white space 108o is free of any devices. In some embodiments, the white space 108o includes dummy devices. The lower standard cell block 102b is arranged around a non-standard cell, e.g., an SRAM 120, and includes both an outer peripheral boundary region 104o and an inner peripheral boundary region 104i. The lower standard cell block 102 also includes upper and lower outer abutment regions 106o as well as upper and lower inner abutment regions 106i. The non-standard cell 120 is also offset from the surrounding lower standard cell block 102b by nonfunctional white space 108i. The inclusion of the white space 108o, 108i, tends to reduce the device density of the resulting integrated circuit layout.

Figure 2A:
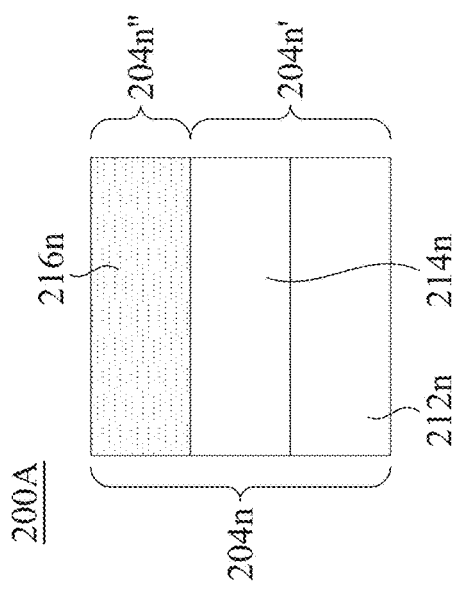
FIGS. 2A and 2B are cross-sectional views of portions of the N-type and P-type standard cell block boundary configurations of FIG. 1 according to some embodiments.
Figure 2B:
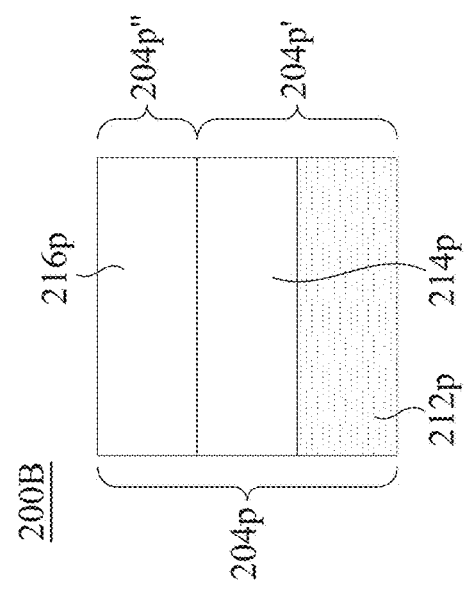

FIGS. 2A and 2B are cross-sectional views of N-type 200A and P-type 200B standard cell block boundary configurations according to some embodiments.

In FIG. 2A, in some embodiments, the cross-section taken along line 2A in FIG. 1, of the N-type standard cell block boundary configurations 200A include an active region 212n, substrate region 214n, and an upper border region, e.g., a PP/VT_P region, 216n. The combination 204n' of the active region 212n and the substrate region 214n correspond to the standard cell height while the height 204n" of the upper border region 216n results in a standard cell block boundary configuration having a height 204n that exceeds the height of the bulk of the adjacent standard cell region.

In FIG. 2B, in some embodiments, the cross-section taken along line 2B in FIG. 1, the P-type standard cell block boundary configurations 200B include an active region 212p, substrate region 214p, and an upper border region, e.g., a NP/VT_N region, 216p. The combination 204p' of the active region 212p and the substrate region 214p correspond to the standard cell height while the height 204p" of the upper border region 216p results in a standard cell block boundary configuration height 204p that exceeds the height of the bulk of the adjacent standard cell region. In some instances, the portions of the standard cells blocks that extend beyond the cell block boundary inhibit direct abutting of standard cells, which reduces the ability to reduce the size of devices includes N-type 200A and P-type 200B standard cell blocks.

FIGS. 3A-3C are cross-sectional views of various N-type boundary configurations according to some embodiments. In some embodiments according to FIG. 3A, the N-type standard cell block boundary configurations 300A include an active region 312n, substrate region 314n, and a modified upper border region, e.g., a logic operation transfer layer (NPVT_Transform), 318n. The NPVT_Transform designation represents a marker layer used in Graphic Database Systems (GDS) for designating a reconfigurable region on a standard cell block for which the final structure is determined by the configuration of the integrated circuit layout. For N-type boundaries on a standard cell block, if there is no abutting structure, the NPVT_Transform region is configured and processed as PP/VT_P structures or, when there is an abutting structure, the NPVT_Transform region will not include a functional structure. Conversely, for P-type boundaries on a standard cell block, if there is no abutting structure, the NPVT_Transform region is configured and processed as NP/VT_N structures or, when there is an abutting structure, the NPVT_Transform region will not include a functional structure. The consistent use of a logic operation transfer layer, 318n, in all modified standard cell blocks helps to ensure that the topography, i.e., cell heights, cell voltages, and/or cell densities, is the same (or at least a better match) for both of the abutting boundary regions. The combination of the active region 312n and the substrate region 314n correspond to the standard cell height while the height of the modified upper border region 318n results in a standard cell block boundary configuration that exceeds the height of the bulk of the adjacent standard cell region.

In some embodiments according to FIG. 3B, the N-type standard cell block boundary configurations 300B include an active region 312n, substrate region 314n, and an upper border region, e.g., a PP/VT_P layer 316n. The combination of the active region 312n and the substrate region 314n correspond to the standard cell height while the height of the upper border region 316n results in a standard cell block boundary configuration that exceeds the height of the bulk of the adjacent standard cell region.

In some embodiments according to FIG. 3C, the N-type standard cell block boundary configurations 300C includes only an active region 312n and substrate region 314n. The combination of the active region 312n and the substrate region 314n correspond to the standard cell height.

FIGS. 4A-4C are cross-sectional views of various P-type boundary configurations according to some embodiments. In some embodiments according to FIG. 4A, the N-type standard cell block boundary configurations 400A include an active region 412p, substrate region 414p, and a modified upper border region, e.g., a logic operation transfer layer (NPVT_Transform), 418p. The consistent use of a logic operation transfer layer, 418p, in all modified standard cell blocks helps to ensure that the topography, i.e., cell heights, is the same for both of the abutting boundary regions. The combination of the active region 412p and the substrate region 414p correspond to the standard cell height while the height of the modified upper border region 418p results in a standard cell block boundary configuration that exceeds the height of the bulk of the adjacent standard cell region.

In some embodiments according to FIG. 4B, the P-type standard cell block boundary configurations 400B include an active region 412p, substrate region 414p, and an upper border region, e.g., a PP/VT_P layer 416p. The combination of the active region 412p and the substrate region 414p correspond to the standard cell height while the height of the upper border region 416p results in a standard cell block boundary configuration that exceeds the height of the bulk of the adjacent standard cell region.

In some embodiments according to FIG. 4C, the P-type standard cell block boundary configurations 400C includes only an active region 412P and substrate region 414p. The combination of the active region 412p and the substrate region 414p correspond to the standard cell height.

Figure 5:
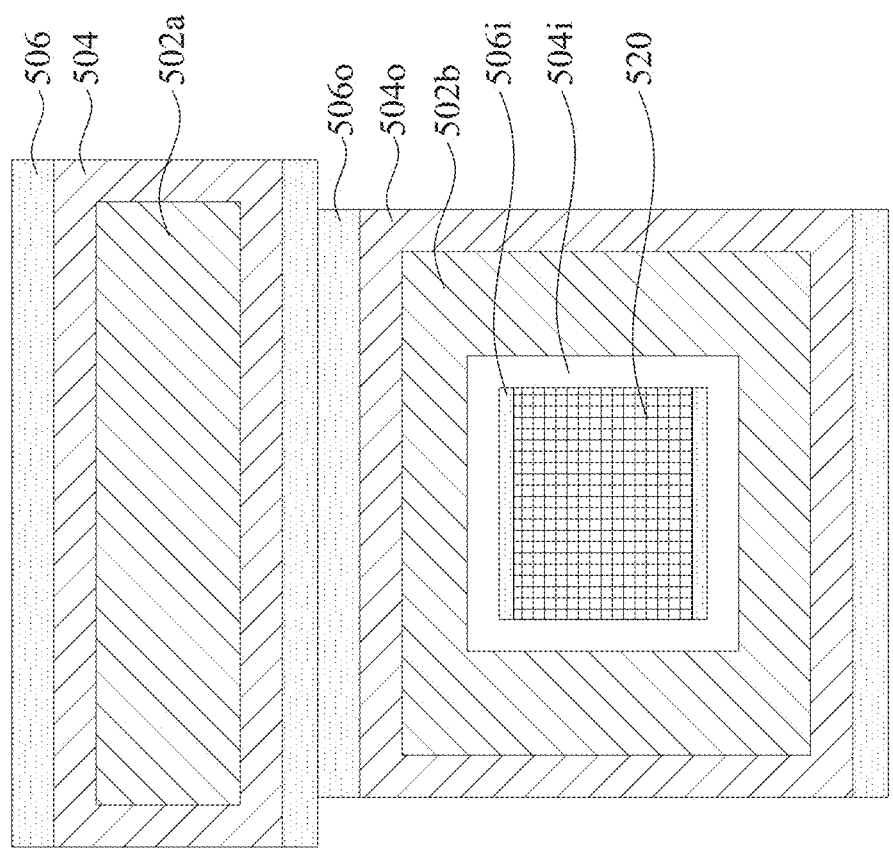
FIG. 5 is a plan view of an embodiment of an initial integrated circuit layout including two modified standard cell block regions.

FIG. 5 is a plan view of an initial integrated circuit layout including two modified standard cell block regions in which the two standard cell blocks 502a, 502b incorporate standard cell block boundary configurations that have been modified to include a logic operation transfer layer (NPVT_Transform) border region having a continuous peripheral active region to create a modified standard cell that allows for the elimination or reduction of the "white" space utilized in previous abutment region configurations, thereby reducing the area required for the IC design layout. The upper standard cell block 502a includes a peripheral boundary region 504 and vertical abutment regions 506. By utilizing the modified upper border region, however, non-functional void or "white" space is reduced or avoided between the abutment region 506 of the upper 502a standard cell block and the outer abutment region 506o of the lower standard cell block 502b. Further, by utilizing the modified upper border region in the inner abutment regions 506i, non-functional void or "white" space is reduced or avoided between the inner periphery of the lower standard cell block 502b and any non-standard cell 520, e.g., an SRAM. The elimination or reduction of the white space 108o, 108i, in comparison with the IC design layout 100 of FIG. 1 to obtain the reduced area IC design layout of FIG. 5 tends to reduce the size and increase the density of the resulting IC design layout.

FIG. 6A is a plan view of a standard cell block 602 that has been modified with top and bottom abutment regions 606a, 606b which include a modified upper border region, e.g., a logic operation transfer layer (NPVT_Transform) having a continuous peripheral active region to create a modified standard cell 600A. FIG. 6B is an enlarged plan view 600B of portions of the modified standard cell block structure of FIG. 6A to provide greater detail regarding the configuration of the modified upper border region.

The modified upper border regions utilized in top and bottom abutment regions 606a, 606b include at least one continuous peripheral active region 608a, 608b (also referred to as oxide defined (OD) regions, active areas (AA), diffusion regions (DR), or a source/drain regions (S/D) in some instances) at the outer periphery (or outer edge) of the corresponding abutment regions of the modified standard cell blocks. Continuous peripheral active regions 608a and 608b extend across substantially an entirety of the standard cell block 602. Inward from the continuous peripheral active regions, some embodiments of the modified upper border regions include at least one row of elongated active regions 610a and, inward from the elongated active regions 610a, at least one row of abbreviated active regions 612a. Elongated active regions 610 have a length greater than abbreviated active regions 612a, but shorter than the continuous peripheral active regions 608a and 680b. In some embodiments, rows of elongated active regions 610a are alternated with rows of abbreviated active regions 612a. In some embodiments, a plurality of strap active regions 608a are configured with a plurality of rows of elongated active regions 610a spaced inward of the continuous peripheral active regions 608a with a plurality of rows of abbreviated active regions 612a spaced inward of the elongated active regions 610a.

FIG. 7A is a plan view of a standard cell block 702 that has been modified with top and bottom abutment regions 706a, 706b having modified cell block boundary configurations that include a modified upper border region, e.g., a logic operation transfer layer (NPVT_Transform) having a continuous peripheral active region to create a modified standard cell 700A. FIG. 7B is an enlarged plan view 700B of portions of the standard cell block structure of FIG. 7A to provide greater detail regarding the configuration of the modified upper border region.

The modified upper border regions utilized in modified abutment regions 706a, 706b include at least one continuous peripheral oxide defined active region 708a, 708b at the outer periphery of the corresponding abutment regions provided on the modified standard cell blocks. Inward from the continuous peripheral active regions, some embodiments of the modified upper border regions include at least one row of elongated active regions 710a and, inward from the elongated active regions 710a, at least one row of abbreviated active regions 712a. In some embodiments, rows of elongated active regions 710a are alternated with rows of abbreviated active regions 712a. In some embodiments, a plurality of strap active regions 708a are configured with a plurality of rows of elongated active regions 710a spaced inward of the continuous peripheral active regions 708a with a plurality of rows of abbreviated active regions 712a spaced inward of the elongated active regions 710a.

In addition to the various configurations of active regions provided on various embodiments of the modified abutment regions 706a, 706b according to FIG. 7B, in some embodiments the modified abutment regions 706a, 706b also include a transition region 716 in which at least some of the inwardly located elongated active regions 710a and abbreviated active regions 712a are replaced by a plurality of conductive structures 714, e.g., polysilicon structures, that are arranged perpendicularly to the remaining portions of the rows of the various active regions 710a, 712a. In some embodiments, the overall width of the transition region containing the conductive structures is between 2 and 3 times the cell poly pitch (CPP). The CPP value for a particular IC design layout is determined by the applicable design rules for the manufacturing process that is to be utilized to manufacture ICs corresponding to a final IC design layout. Regardless of the configuration of the transition region, however, at least the outermost continuous peripheral active region 708a is maintained and extends, uninterrupted, across the transition region.

FIG. 8A is a plan view of a non-rectangular standard cell block having first and second standard cell block regions 802a, 802b with each of the cell block regions 802a, 802b including modified top and bottom abutment regions 806a, 806b, 806c. Each of the modified abutment regions 806a, 806b, 806c include a modified standard cell block boundary configuration that includes a modified upper border region, e.g., a logic operation transfer layer (NPVT_Transform) having a continuous peripheral active region to create a modified standard cell 800A. FIG. 8B is an enlarged plan view 800B of portions of the standard cell block structure of FIG. 8A to provide greater detail regarding the configuration of the modified upper border regions.

The modified upper border regions utilized in modified abutment regions 806a, 806b, 806c include at least one continuous peripheral active region 808a, 808b, 808c at the outer periphery of the corresponding abutment regions provided on the modified standard cell blocks. Inward from the continuous peripheral active regions, some embodiments of the modified upper border regions include at least one row of elongated active regions 810a and, inward from the elongated active regions 810a, at least one row of abbreviated active regions 812a. In some embodiments, rows of elongated active regions 810a alternate with rows of abbreviated active regions 812a. In some embodiments, a plurality of continuous peripheral active regions 808a are configured with a plurality of rows of elongated active regions 810a spaced inward of the continuous peripheral active regions 808a with a plurality of rows of abbreviated active regions 812a spaced inward of the elongated active regions 810a.

In addition to the various configurations of active regions provided on various embodiments of the modified abutment regions 806a, 806b according to FIG. 8B, in some embodiments the modified abutment regions 806a, 806b also include a transition region 816 extending between the standard cell block regions 802a, 802b in which at least some of the inwardly located elongated active regions 810a and abbreviated active regions 812a are replaced by a plurality of conductive structures 814, e.g., polysilicon structures, that are arranged perpendicularly to the remaining portions of the rows of the various active regions 810a-c, 812a-c. In some embodiments, the overall width of the transition region containing the conductive structures is between 2 and 4 times the cell poly pitch (CPP). Regardless of the configuration of the transition region, however, at least the outermost strap active regions 808a-c are maintained and extend to the transition region in those embodiment in which the transition region 816 terminates one or more continuous, but offset, active regions 808a, 808b and uninterrupted, across the transition region(s) in those embodiments in which the transition region 816 is in a medial position relative to the strap active region(s) 808c. In some embodiments, the transition region 816 defines a vertical boundary adjacent the upper portion of the standard cell block regions 802a, while in other embodiments, the transition region 816 extends only between the lower portion of the first standard cell block region 802a and the adjacent vertical boundary of the second standard cell block region 802b (not shown).

Figures 9A, 9B:
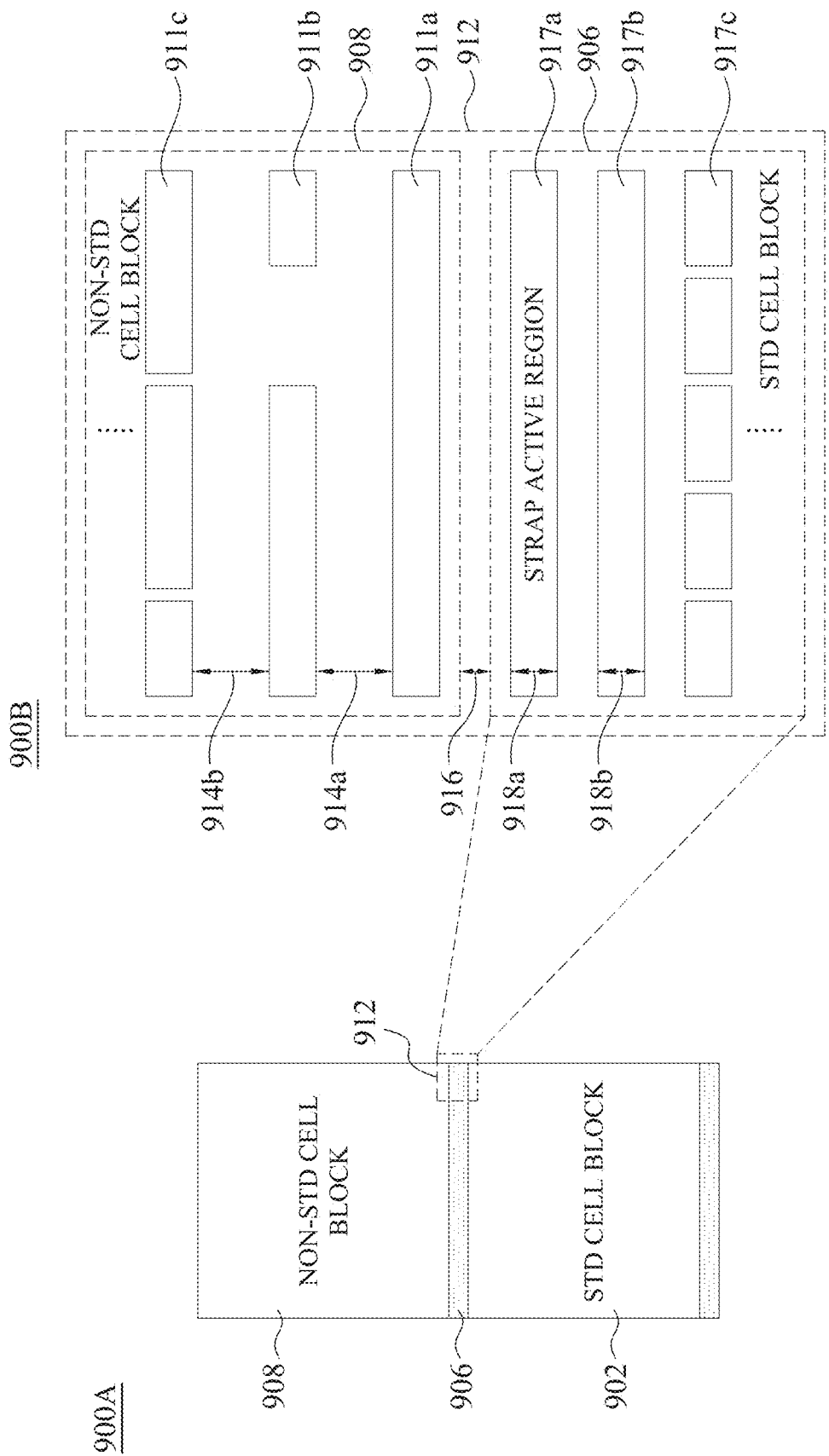
FIG. 9A is a plan view of an embodiment of a standard cell block with modified top and bottom regions vertically abutting a non-standard cell block and FIG. 9B is an enlarged plan view of the abutting structures.

FIG. 9A is a plan view 900A of a standard cell block vertically abutting a non-standard cell block and FIG. 9B is an enlarged plan view 900B of the abutting structures. Embodiments according to FIG. 9A include a standard cell block 902 modified to include at least one modified abutment region 906 vertically abutting a non-standard cell block 908, e.g., a logic operation transfer layer (NPVT_Transform) having a continuous peripheral active region to create a modified standard cell. FIG. 9B is an enlarged plan view 900B of the abutting structures of region 912 according to some embodiments.

The modified upper border regions utilized in modified abutment region 906 include at least one continuous peripheral active region 917a, 917b at the outer periphery of the modified abutment region 906 provided on the modified standard cell block 902. In some embodiments, the widths 918a, 918b of the strap active region(s) is about 2-3 fin widths. The fin width value for the IC design layout under development is determined by the applicable design rules for the manufacturing process that is to be utilized to manufacture ICs corresponding to a final IC design layout. Inward from the strap active regions, some embodiments of the modified upper border regions include at least one row of elongated active regions (not shown) and, inward from the continuous 917a, 917b and/or elongated active regions, at least one row of abbreviated active regions 917c.

Opposite the modified standard cell block 902 is non-standard cell block 908 having a border region including a series of active regions 911a, 911b, 911c located at the outer periphery of the abutment region on the non-standard cell block 908. In some embodiments, the spacings 914a, 914b of the active region(s) on the non-standard cell block 908 is at least about 2 fin widths. The fin width value for the IC design layout under development is determined by the applicable design rules for the manufacturing process that is to be utilized to manufacture ICs corresponding to a final IC design layout. In some embodiments, the modified standard cell block 902 is spaced from the non-standard cell block 908 by a separation distance 916 that is on the order of about 0.3 μM.

FIG. 10A is a plan view 1000A of a standard cell block horizontally abutting a non-standard cell block and FIG. 10B is an enlarged plan view 1000B of the abutting structures. Embodiments according to FIG. 10A include a modified standard cell block 1002 horizontally abutting a non-standard cell block 1008.

FIG. 10B is an enlarged plan view 1000B of the abutting structures of region 1012 according to some embodiments in which the modified standard cell block includes a transition region 1016 in which at least some of the inwardly located strap active regions 1017a, elongated active regions 1017b and/or abbreviated active regions 1017c are replaced by a plurality of conductive structures 1014a, e.g., polysilicon structures, that are arranged perpendicularly to the remaining portions of the rows of the various active regions 1017a-c. In some embodiments, the overall width of the transition region 1016 containing the conductive structures is between 2 and 6 times the cell poly pitch (CPP) depending upon the portion of the transition region provided on the modified standard cell block 1002.

Opposite the modified standard cell block 1002 is non-standard cell block 1008 having a border region including a series of active regions 1011a, 1011b, located at the outer periphery of the abutment region on the non-standard cell block 1008. In some embodiments, non-standard cell block 1008 includes at least a portion of a transition region 1016 in which at least some of the active regions 1011a, 1011b are replaced by a plurality of conductive structures 1014b, e.g., polysilicon structures, that are arranged perpendicularly to the remaining portions of the rows of the various active regions 1011a-b. In some embodiments, the overall width of the transition region 1016 containing the conductive structures is between 2 and 6 times the cell poly pitch (CPP) depending upon the portion of the transition region provided on the non-standard cell block 1008. In some embodiments, the full width of the transition region 1016 is apportioned evenly between the modified standard cell block 1002 and the non-standard cell block 1008. In other embodiments, the total width of the transition region 1016 comprises unequal transition region contributions from the modified standard cell block 1002 and the non-standard cell block 1008, e.g., 4:1 to 1:4 ratios of the respective contributions.

FIG. 11A is a plan view 1100A of a first standard cell block with modified top and bottom regions that include a logic operation transfer layer (NPVT_Transform) having a continuous peripheral active region to create a modified standard cell vertically abutting a second standard cell block and FIG. 11B is an enlarged plan view of the abutting structures. Embodiments according to FIG. 11A include a pair of upper and lower modified standard cell blocks 1102a, 1102b with at least one modified abutment region 1106 vertically abutting the other modified standard cell block 1108. FIG. 11B is an enlarged plan view 1100B of the abutting structures of region 1112 according to some embodiments.

The modified upper border regions utilized in modified abutment regions 1106a, 1106b include at least one strap active region 1108a, 1108b at the outer periphery of the modified abutment regions 1106 provided on the modified standard cell block 1102. In some embodiments, the widths of the strap active region(s) are about 2-3 fin widths. The fin width value for the IC design layout is determined by the applicable design rules for the manufacturing process that is to be utilized to manufacture ICs corresponding to a final IC design layout.

Inward from the strap active regions, some embodiments of the modified upper border regions include at least one row of elongated active regions (not shown) and, inward from the continuous 1108a, 1108b and/or elongated active regions, at least one row of abbreviated active regions 1108c. In some embodiments, the increased compatibility between the abutting edges of the modified standard cell blocks 1102, 1108 permits the non-standard cell blocks to be separated by a separation distance 1116 that is on the order of about 0.1-0.03 μm.

Figure 12A:
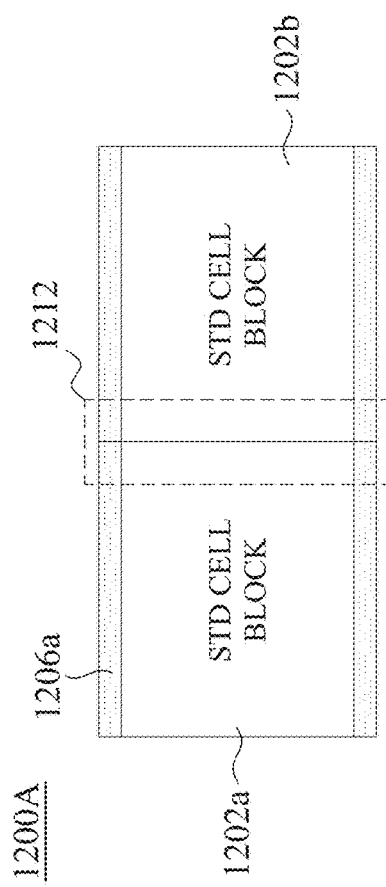
FIG. 12A is a plan view of an embodiment of a first standard cell block with modified top and bottom regions horizontally abutting a second standard cell block and FIG. 12B is an enlarged plan view of the abutting structures.
Figure 12B:
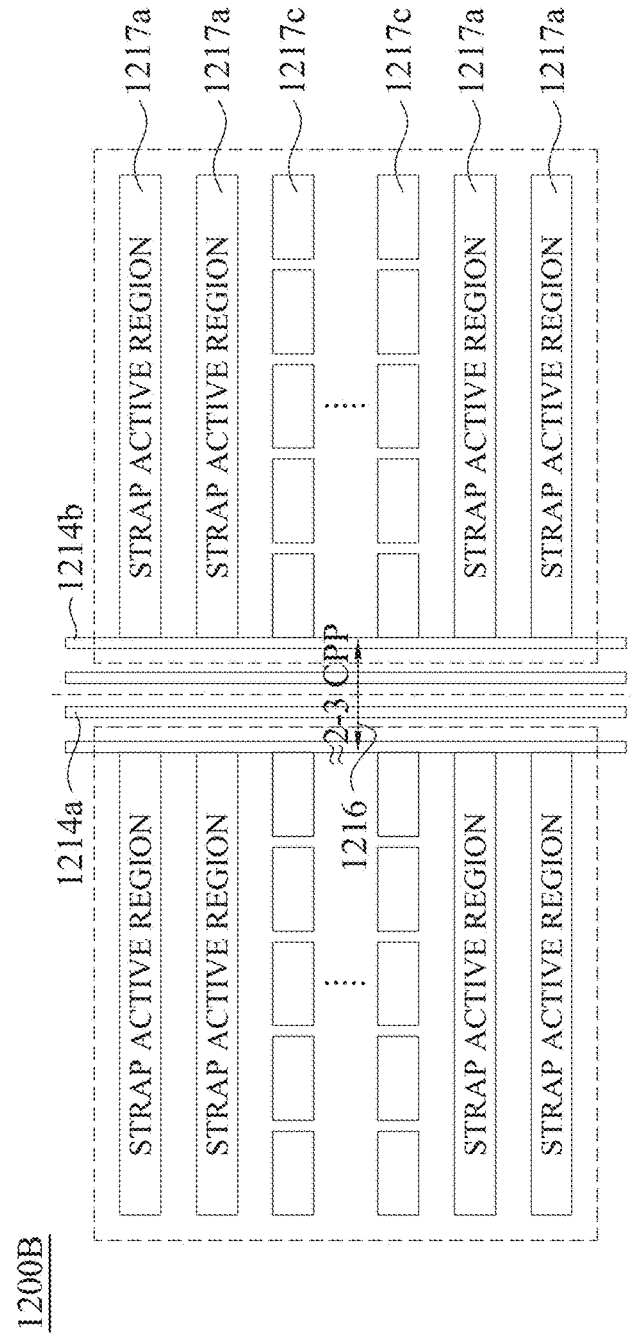

FIG. 12A is a plan view 1200A of an embodiment of a standard cell block horizontally abutting another standard cell block and FIG. 12B is an enlarged plan view 1200B of the abutting structures. Embodiments according to FIG. 12A include modified standard cell blocks 1202a, 1202b in a horizontally abutting configuration.

FIG. 12B is an enlarged plan view 1200B of the abutting structures of region 1212 according to some embodiments in which the modified standard cell blocks 1202a, 1202b include a transition region 1216 in which at least some of the inwardly located strap active regions 1217a, elongated active regions (not shown) and/or abbreviated active regions 1217c are replaced by a plurality of conductive structures 1214a, 1214b, e.g., polysilicon structures, that are arranged perpendicularly to the remaining portions of the rows of the various active regions 1217a-b. In some embodiments, the overall width of the transition region 1216 containing the conductive structures is between 2 and 3 times the cell poly pitch (CPP) depending upon the portion of the transition region provided on each of the modified standard cell blocks 1202a, 1202b. In some embodiments, the full width of the transition region 1216 is apportioned evenly between the modified standard cell blocks 1202a, 1202b and in other embodiments, the total width of the transition region 1216 comprises unequal transition region contributions from each of the modified standard cell blocks 1202a, 1202b, e.g., 4:1 to 1:4 ratios of the respective contributions.

Figure 13:
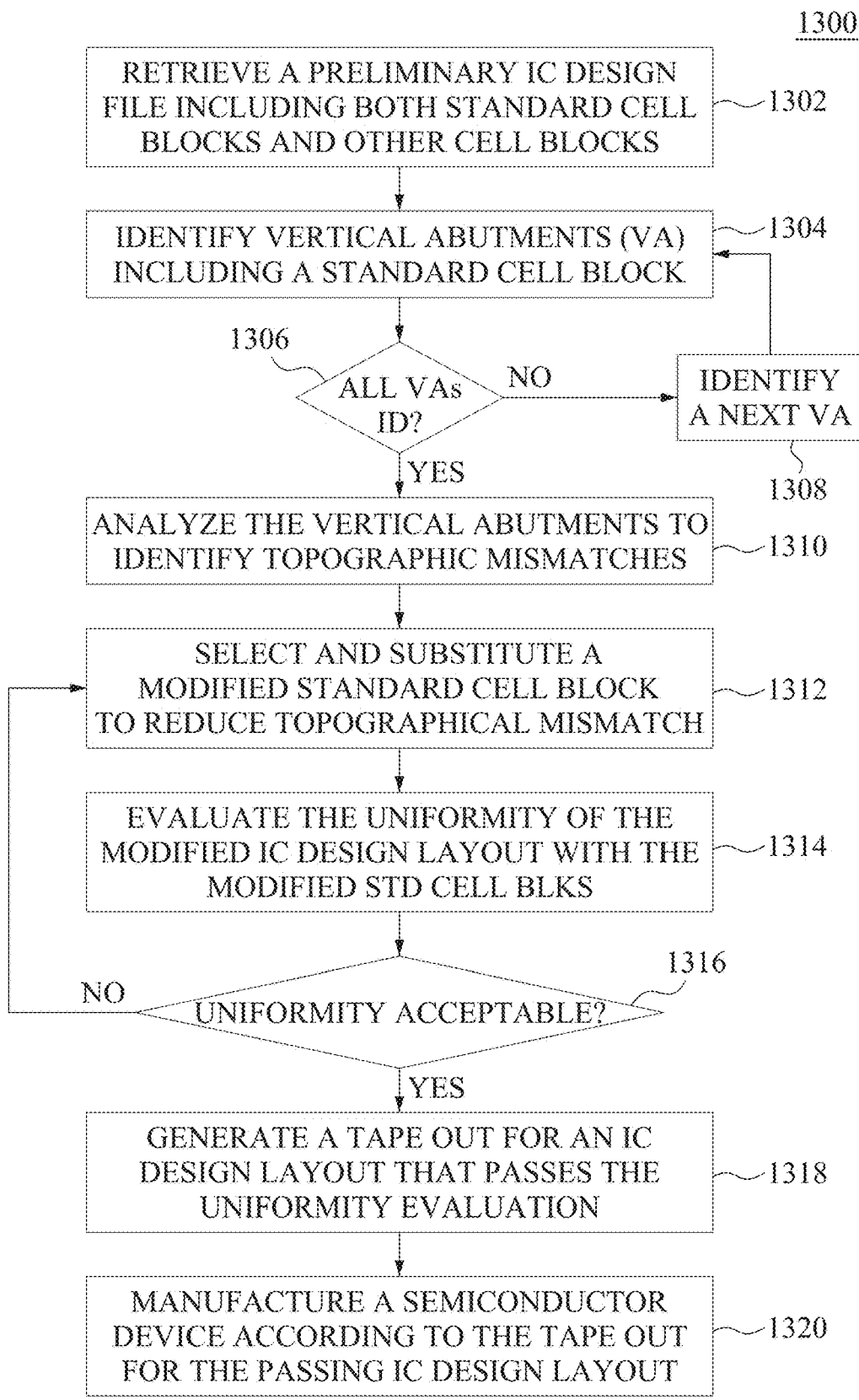
FIG. 13 is a flow diagram of a method, according to some embodiments, for modifying an IC design layout to include modified standard cell blocks in accordance with some embodiments.

FIG. 13 is a flowchart of a method 1300 according to some embodiments for improving the uniformity of the boundary structures between abutting structures on two adjacent cell blocks and reducing the degrading effects of the density gradient effect (DGE) resulting from mismatched structural densities in adjacent regions of the IC design layout, i.e., structures that have significantly higher or lower structural densities or structural configurations, e.g., cell heights, line widths, and/or line spacing (collectively topography) that are situated within an impact area (an area over which patterning, etching, and/or deposition effects are known or expected to occur) associated with vertical and/or horizontal abutment structures and adjacent cell regions.

Evaluating the relative structural densities and topography of peripheral structures will, in some embodiments, allow for mitigation of the DGE using one or more modified standard cell blocks. By recognizing and compensating for the DGE and other effects associated with mismatched structural densities and/or topography, the IC design layout modification and associated improvement in structural density and topographic uniformity, according to some embodiments, will improve the uniformity of the processing and/or the active structures of the resulting semiconductor device, thereby increasing the likelihood that the semiconductor device will meet or exceed design specification.

In some embodiments of methods 1300 according to FIG. 13, in operation 1302, a preliminary IC design layout including both standard cell blocks and other (non-standard) cellblocks is retrieved for evaluation. In operation 1304, the preliminary IC design file is evaluated to identify vertical abutments (VA) including at least one standard cell block. Operation 1306 involves a query regarding the extent to which the vertical abutments have been successfully identified. If fewer than all the vertical abutments have been identified, method 1300 branches from operation 1306 to operation 1308 in order to identify the next vertical abutment for evaluation. When all the vertical abutments have been identified, method 1300 branches to operation 1310 for analyzing the identified vertical abutments to identify topographic mismatches. For those identified vertical abutments that are identified as including a topographic mismatch exceeding a predetermined design threshold in operation 1310, method 1300 proceeds to operation 1312 during which a modified standard cell block incorporating a logic operation transfer layer (NPVT_Transform) border region having a continuous peripheral active region is selected for substitution into the IC design file. The alternative standard cell block selected in operation 1312 provides the same functionality as the standard cell block that is being replaced while simultaneously reducing the topographic mismatch between the alternative standard cell block and the abutting cell block.

In some embodiments, libraries of alternative standard cell blocks are available for a designer's selection and/or modification for use in an IC layout design. Each of the modified standard cell blocks available in a library has passed complex advanced technology rule checks (DRC) and will be useful in addressing at least one of the types of standard cell block abutment differences found in the IC layout design. Modified standard cell blocks according to some embodiments provide a range of options for matching and/or approximating one or more parameters of the adjacent active areas, e.g., gate length, gate density, and/or operating voltage (VDD) types for placement between various combinations of active areas.

In some embodiments, IC designs including, for example, decoupling capacitor (DCAP) regions, alternative standard cell blocks provide a range of options for matching and/or approximating one or more parameters of the adjacent active areas, e.g., cell height, gate length, gate density, different doping, structures, Lg, gate density, Vt and/or operating voltage (VDD) types in the abutment region(s). Using alternative standard cell blocks according to some embodiments allows a designer to achieve better matching of poly/active area densities across the abutment regions of an IC layout design. This improved configuration matching, in turn, reduces DGE within at least the abutment regions and improves the yields and/or reliability of the resulting devices manufactured from such modified designs.

Because embodiments of the alternative standard cell blocks incorporate specific design rules for known and/or anticipated types of abutment differences, DRC update revisions and node-to-node porting are simplified and able to be made efficiently across a family or a library of alternative standard cell block designs. In some embodiments, the library of modified standard cell block designs, e.g., those designs that are modified to incorporate logic operation transfer layer (NPVT_Transform) abutment regions having a continuous peripheral active region, will include modified standard cell blocks suitable for use in abutment regions adjacent core, input/output, and/or DCAP active areas as well as active areas utilizing different operating voltages. For example, in some embodiments IC layout designs incorporate a standard threshold voltage (SVT), a low threshold voltage (LVT), and/or an ultralow threshold voltage (ULVT) regions or standard cell blocks configured for providing structures adapted for the various threshold voltages. The configuration of the alternative standard cell blocks according to some embodiments would be modified whereby an alternative standard cell block is available for each of the types of operating voltage abutments between a first and second active area as reflected below in TABLE 1.

TABLE 1

| Second Active Area | First Active Area Operating Voltage | | |
|---|---|---|---|
| Operating Voltage | SVT | LVT | ULVT |
| SVT | SVT | SVT/LVT | SVT/ULVT |
| LVT | LVT/SVT | LVT | LVT/ULVT |
| ULVT | ULVT/SVT | ULVT/LVT | ULVT |

Turning to TABLE 1, for example, if a first active area is configured for low voltage operation (LVT) and an abutting second active area is configured for ultralow voltage operation (ULVT), a modified standard cell block interposed between the first and second active areas in some embodiments would have a combination of both LVT structures and ULVT structures, i.e., a LVT/ULVT configuration, with the modified standard cell block having an abutment region configured to be suitable adjacent both LVT and ULVT regions.

In operation 1314, the modified IC design layout is evaluated for overall structural/device density uniformity. Operation 1316 involves a query regarding the extent to which the uniformity evaluation of operation 1314 meets a predetermined uniformity target value. If the uniformity evaluation score is below the uniformity target value, method 1300 branches back to operation 1312 to improve the selection of the alternative standard cell blocks by selectively replacing those alternative standard cell blocks defining abutments that are contributing a relatively greater share to the total reduction in the uniformity evaluation score.

For those modified IC design layouts that pass the uniformity evaluation, method 1300 includes an optional operation 1318, in some embodiments, during which a tape out data file corresponding to the passing modified IC design layout is generated. For those modified IC design layouts for which a tape out data file is generated, the tape out data file will be used to manufacture a semiconductor device according to the passing modified IC design layout in optional operation 1320.

In some embodiments, the modified device layout will be evaluated for structural density and topographic uniformity in the abutment regions. In those instances in which a structural density and/or topographic uniformity target value is met, the modified IC design layout will be approved for tape out and, ultimately, the optional manufacture of the corresponding IC device. In some embodiments, in those instances in which the structural density and/or topographic uniformity target value is not met, the performance of the individual alternative standard cell blocks will be evaluated to identify the lowest performing alternative standard cell blocks. These low performing alternative standard cell blocks are then modified or replaced in order to improve the overall structural density and/or topographic uniformity performance of the IC design layout.

Figure 14:
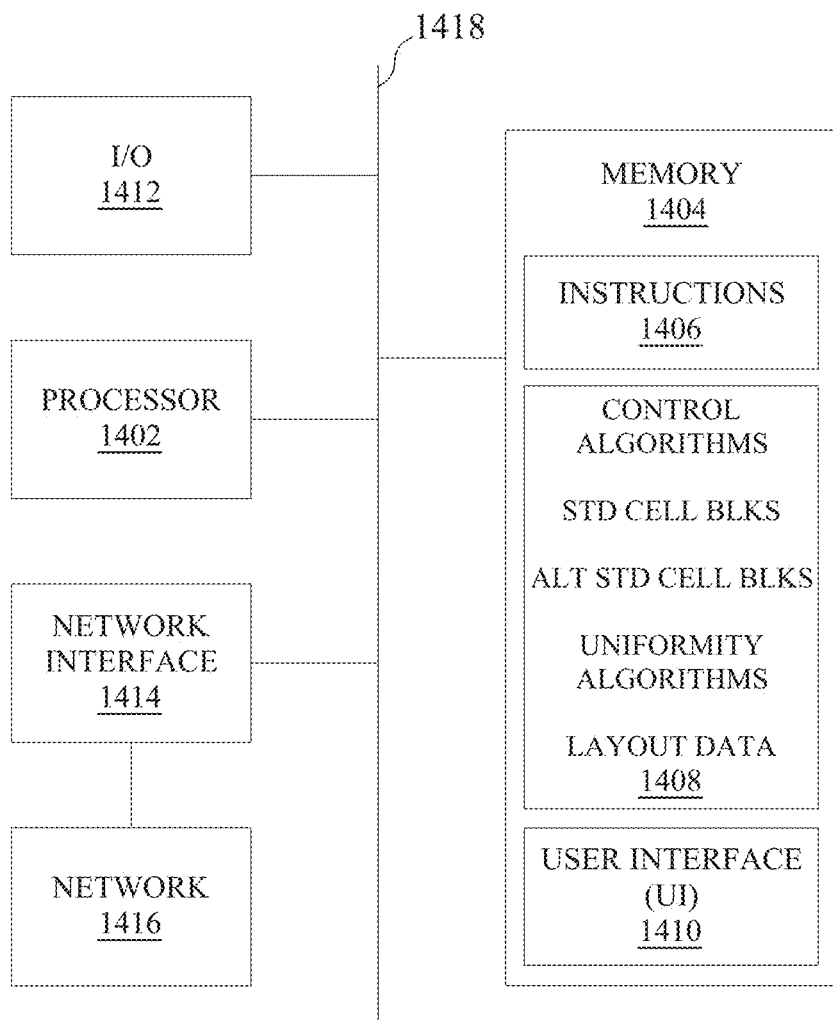
FIG. 14 is a schematic view of an electronic process control (EPC) system useful in the operation of an IC design layout modification in accordance with some embodiments.

FIG. 14 is a block diagram of an electronic process control (EPC) system 1400, in accordance with some embodiments. Methods described herein of generating cell layout diagrams, in accordance with one or more embodiments, are implementable, for example, using EPC system 1400, in accordance with some embodiments. In some embodiments, EPC system 1400 is a general purpose computing device including a hardware processor 1402 and a non-transitory, computer-readable storage medium 1404. Storage medium 1404, amongst other things, is encoded with, i.e., stores, computer program code (or instructions) 1406, i.e., a set of executable instructions. Execution of computer program code 1406 by hardware processor 1402 represents (at least in part) an EPC tool which implements a portion of, or all, the methods described herein in accordance with one or more (hereinafter, the noted processes and/or methods).

Hardware processor 1402 is electrically coupled to computer-readable storage medium 1404 via a bus 1418. Hardware processor 1402 is also electrically coupled to an I/O interface 1412 by bus 1418. A network interface 1414 is also electrically connected to hardware processor 1402 via bus 1418. Network interface 1414 is connected to a network 1416, so that hardware processor 1402 and computer-readable storage medium 1404 are connected to external elements via network 1416. Hardware processor 1402 is configured to execute computer program code 1406 encoded in computer-readable storage medium 1404 in order to cause EPC system 1400 to be usable for performing a portion of, or all, the noted processes and/or methods. In one or more embodiments, hardware processor 1402 is a central processing unit (CPU), a multi-processor, a distributed processing system, an application specific integrated circuit (ASIC), and/or a suitable processing unit.

In one or more embodiments, computer-readable storage medium 1404 is an electronic, magnetic, optical, electromagnetic, infrared, and/or a semiconductor system (or apparatus or device). For example, computer-readable storage medium 1404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1404 includes a compact disk-read only memory (CD-ROM), a compact disk-read/write (CD-R/W), and/or a digital video disc (DVD).

In one or more embodiments, storage medium 1404 stores computer program code 1406 configured to cause EPC system 1400 (where such execution represents (at least in part) the EPC tool) to be usable for performing a portion of, or all, the noted processes and/or methods. In one or more embodiments, storage medium 1404 also stores information which facilitates performing a portion of, or all, the noted processes and/or methods. In one or more embodiments, storage medium 1404 stores process control data 1408 including, in some embodiments, control algorithms, active area data, transition cell data, uniformity algorithms, layout data, and constants, target ranges, set points, and code for enabling statistical process control (SPC) and/or model predictive control (MPC) based control of the various processes.

EPC system 1400 includes I/O interface 1412. I/O interface 1412 is coupled to external circuitry. In one or more embodiments, I/O interface 1412 includes a keyboard, keypad, mouse, trackball, trackpad, touchscreen, and/or cursor direction keys for communicating information and commands to hardware processor 1402.

EPC system 1400 also includes network interface 1414 coupled to hardware processor 1402. Network interface 1414 allows EPC system 1400 to communicate with network 1416, to which one or more other computer systems are connected. Network interface 1414 includes wireless network interfaces such as BLUETOOTH, WIFI, WIMAX, GPRS, or WCDMA; or wired network interfaces such as ETHERNET, USB, or IEEE-1364. In one or more embodiments, a portion of, or all, noted processes and/or methods, is implemented in two or more EPC systems 1400.

EPC system 1400 is configured to receive information through I/O interface 1412. The information received through I/O interface 1412 includes one or more of instructions, data, design rules, process performance histories, target ranges, set points, and/or other parameters for processing by hardware processor 1402. The information is transferred to hardware processor 1402 via bus 1418. EPC system 1400 is configured to receive information related to a user interface (UI) through I/O interface 1412. The information is stored in computer-readable medium 1404 as user interface (UI) 1410.

In some embodiments, a portion of, or all, the noted processes and/or methods is/are implemented as a stand-alone software application for execution by a processor. In some embodiments, a portion of, or all, the noted processes and/or methods is/are implemented as a software application that is a part of an additional software application. In some embodiments, a portion of, or all, the noted processes and/or methods is/are implemented as a plug-in to a software application. In some embodiments, at least one of the noted processes and/or methods is implemented as a software application that is a portion of an EPC tool. In some embodiments, a portion of, or all, the noted processes and/or methods is implemented as a software application that is used by EPC system 1400.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 15:
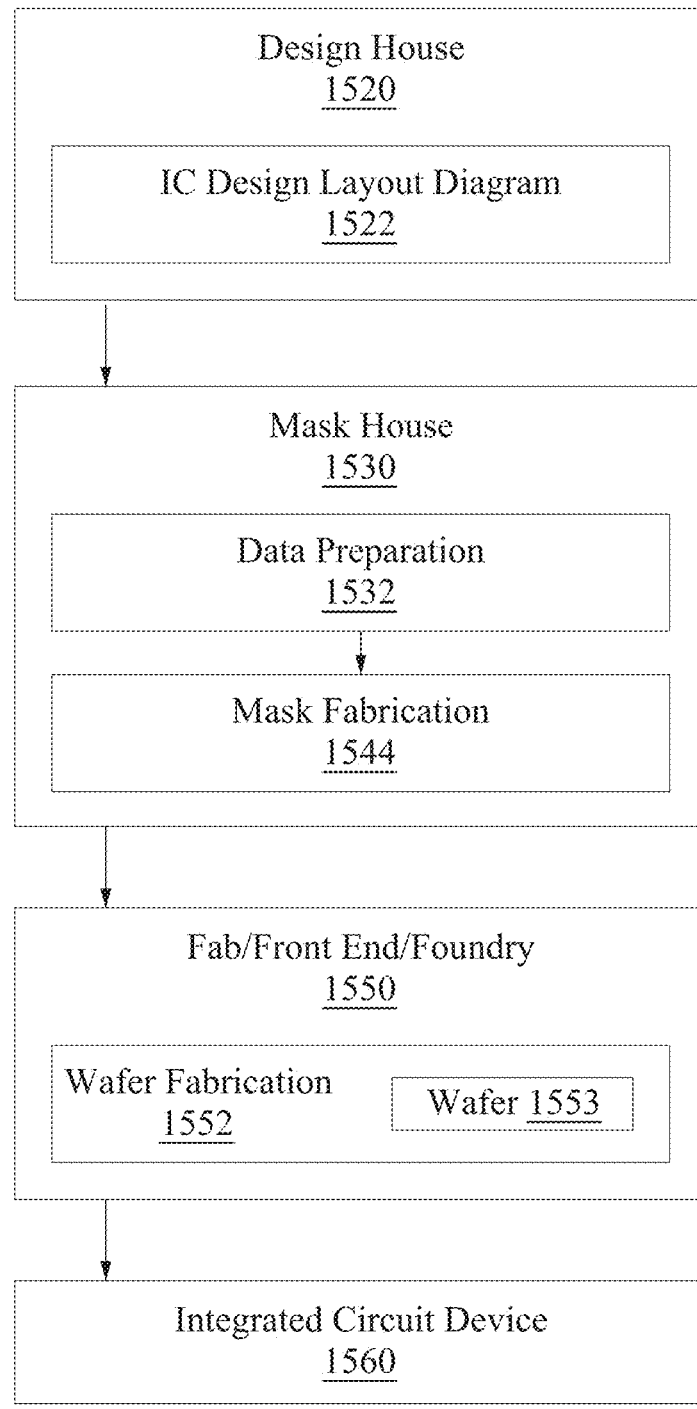
FIG. 15 is a flow diagram of a manufacturing process for an integrated circuit in accordance with some embodiments.

FIG. 15 is a block diagram of an integrated circuit (IC) manufacturing system 1500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1500.

In FIG. 15, IC manufacturing system 1500 includes entities, such as a design house 1520, a mask house 1530, and an IC manufacturer/fabricator ("fab") 1550, that interact with one another in the design, development, and manufacturing cycles and/or services related to manufacturing an IC device 1560. The entities in system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1520, mask house 1530, and IC fab 1550 is owned by a single larger company. In some embodiments, two or more of design house 1520, mask house 1530, and IC fab 1550 coexist in a common facility and use common resources.

Design house (or design team) 1520 generates an IC design layout diagram 1522. IC design layout diagram 1522 includes various geometrical patterns designed for an IC device 1560. The geometrical patterns correspond to patterns of metal, oxide, or semiconductor layers that make up the various components of IC device 1560 to be fabricated. The various layers combine to form various IC features. For example, a portion of IC design layout diagram 1522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1520 implements a proper design procedure to form IC design layout diagram 1522. The design procedure includes one or more of logic design, physical design or place and route. IC design layout diagram 1522 is presented in one or more data files having information of the geometrical patterns. For example, IC design layout diagram 1522 is be expressed in a GDSII file format or DFII file format, according to some embodiments.

In some embodiments, the configuration of a modified IC design layout diagram is adjusted, such as by method 1300, in order to improve the compatibility of abutting edges and thereby reduce the device area of the final IC design layout when compared with an unmodified IC design layout, the modified IC design layout diagram reflecting the result(s) of modifying the boundary structures and/or the positions of standard cell blocks within the IC design layout diagram.

Mask house 1530 includes data preparation 1532 and mask fabrication 1544. Mask house 1530 uses IC design layout diagram 1522 to manufacture one or more masks 1545 to be used for fabricating the various layers of IC device 1560 according to IC design layout diagram 1522. Mask house 1530 performs mask data preparation 1532, where IC design layout diagram 1522 is translated into a representative data file ("RDF"). Mask data preparation 1532 provides the RDF to mask fabrication 1544. Mask fabrication 1544 includes a mask writer. A mask writer converts the RDF to an image on a substrate, such as a mask (reticle) 1545 or a semiconductor wafer 1553. The design layout diagram 1522 is manipulated by mask data preparation 1532 to comply with the characteristics of the mask writer and/or requirements of IC fab 1550. In FIG. 15, mask data preparation 1532 and mask fabrication 1544 are illustrated as separate elements. In some embodiments, mask data preparation 1532 and mask fabrication 1544 are collectively referred to as mask data preparation.

In some embodiments, mask data preparation 1532 includes optical proximity correction (OPC) which uses lithography enhancement techniques to compensate for image errors, such as those that arise from diffraction, interference, other process effects and the like. OPC adjusts IC design layout diagram 1522. In some embodiments, mask data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1532 includes a mask rule checker (MRC) that checks the IC design layout diagram 1522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1522 to compensate for limitations during mask fabrication 1544, which undoes part of the modifications performed by OPC in order to meet mask creation rules.

In some embodiments, mask data preparation 1532 includes lithography process checking (LPC) that simulates processing that will be implemented by IC fab 1550 to fabricate IC device 1560. LPC simulates this processing based on IC design layout diagram 1522 to create a simulated manufactured device, such as IC device 1560. In some embodiments, the processing parameters in LPC simulation include parameters associated with various processes of the IC manufacturing cycle, parameters associated with tools used for manufacturing the IC, and/or other aspects of the manufacturing process. LPC accounts for various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC, and/or MRC are be repeated to produce a further refined IC design layout diagram 1522.

One of ordinary skill in the art would understand that the above description of mask data preparation 1532 has been simplified for the purposes of clarity. In some embodiments, data preparation 1532 includes additional features such as a logic operation (LOP) to modify the IC design layout diagram 1522 according to manufacturing rules. Additionally, the processes applied to IC design layout diagram 1522 during data preparation 1532 is executed in a variety of different orders, according to some embodiments.

After mask data preparation 1532 and during mask fabrication 1544, a mask 1545 or a group of masks 1545 are fabricated based on the modified IC design layout diagram 1522. In some embodiments, mask fabrication 1544 includes performing one or more lithographic exposures based on IC design layout diagram 1522. In some embodiments, an electron-beam (e-beam) or a mechanism of multiple e-beams is used to form a pattern on a mask (photomask or reticle) 1545 based on the modified IC design layout diagram 1522. In some embodiments, mask 1545 is formed in various technologies. In some embodiments, mask 1545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1545 includes a transparent substrate (e.g., fused quartz) and an opaque material (e.g., chromium) coated in the opaque regions of the binary mask.

In another example, mask 1545 is formed using a phase shift technology. In a phase shift mask (PSM) version of mask 1545, various features in the pattern formed on the phase shift mask are configured to have proper phase difference to enhance the resolution and imaging quality. In various examples, the phase shift mask is attenuated PSM or alternating PSM. The mask(s) generated by mask fabrication 1544 is used in a variety of processes. For example, such a mask(s) is used in an ion implantation process to form various doped regions in semiconductor wafer 1553, in an etching process to form various etching regions in semiconductor wafer 1553, and/or in other suitable processes.

IC fab 1550 includes wafer fabrication 1552. IC fab 1550 is an IC fabrication business that includes one or more manufacturing facilities for the fabrication of a variety of different IC products. In some embodiments, IC Fab 1550 is a semiconductor foundry. For example, according to some embodiments, a manufacturing facility for the front end fabrication of a plurality of IC products (front-end-of-line (FEOL) fabrication), while a second manufacturing facility is provided the back end fabrication for the interconnection and packaging of the IC products (back-end-of-line (BEOL) fabrication), and a third manufacturing facility is provided other services for the foundry business.

In some embodiments of the present disclosure, fin dimensional adjustment includes operations associated with making an array of fins across an entirety of the fin-containing functional areas of the integrated circuit, followed by modification of fin dimensions in at least one fin-containing functional area of the integrated circuit. In some embodiments of the present disclosure, the fins of different fin-containing functional areas are formed to a final fin shape or fin dimensional profile separately, in a single fin-formation manufacturing flow for each fin-containing functional area of the IC. In some embodiments, the fin dimension adjustment occurs by forming fins in a layer of fin material, or fin substrate, by applying mask layer to a top surface of the fin material, patterning the mask layer with a pattern that corresponds to the locations of fins in one or more of the fin-containing functional areas, exposing a top surface of the fin material through the mask layer, and etching the fin material to form fins in the fin substrate. In some embodiments, the fins are formed in a single functional area of the IC with a final fin dimension, the selected fin dimension (or, fin height) as described above in operation 1550.

A patterned layer of mask material formed on a semiconductor substrate is made of a mask material that includes one or more layers of photoresist, polyimide, silicon oxide, silicon nitride (e.g., $Si_3N_4$), SiON, SiC, SiOC, mixtures, or combinations thereof. In some embodiments, masks include a single layer of mask material. In some embodiments, a mask includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, fins of areas not covered by the mask, or fins in open areas of the pattern, are etched to modify a fin dimension. In some embodiments, the etching is performed on a top surface of fins with fin sides that are completely covered by adjoining dielectric support material deposited between fins in a previous manufacturing step. Etching of top surfaces of fins is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof. In some embodiments, etching the fins is performed by exposing an upper portion of fin material, extending above a top surface of a dielectric support medium deposited between fins and recessed below a top surface of the fin height in a prior manufacturing step, to a liquid chemical etch solution comprising one or more of the liquid chemical etchants described above. An upper portion of the fin material includes a top surface and sides of the fin material.

In some embodiments, the etching process is a dry-etch or plasma etch process. Plasma etching of a substrate material is performed using halogen-containing reactive gasses excited by an electromagnetic field to dissociate into ions. Reactive or etchant gases include $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed fin material by alternating electromagnetic fields or by fixed bias according to methods of plasma etching that are known in the art. In some embodiments, etching processes include presenting the exposed portions of fins of the functional area in an oxygen-containing atmosphere to oxidize an outer portion of the fin material, followed by a chemical trimming process such as plasma-etching or liquid chemical etching, as described above, to remove the oxidized semiconductor fin material and leave a modified fin behind.

In some embodiments, fin oxidation followed by chemical trimming is performed to provide greater selectivity to the fin material and to reduce a likelihood of accidental fin material removal during a manufacturing process. In some embodiments, the exposed portions of fins of the functional area are top surfaces of the fins, the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC fab 1550 uses mask(s) 1545 fabricated by mask house 1530 to fabricate IC device 1560. Thus, IC fab 1550 at least indirectly uses IC design layout diagram 1522 to fabricate IC device 1560. In some embodiments, semiconductor wafer 1553 is fabricated by IC fab 1550 using mask(s) 1545 to form IC device 1560. In some embodiments, the IC fabrication includes performing one or more lithographic exposures based at least indirectly on IC design layout diagram 1522. Semiconductor wafer 1553 includes a silicon substrate or other proper substrate having material layers formed thereon. Semiconductor wafer 1553 further includes one or more of various doped regions, dielectric features, multi-level interconnects, and the like (formed at subsequent manufacturing steps).

Details regarding an integrated circuit (IC) manufacturing system (e.g., system 1500 of FIG. 15), and an IC manufacturing flow associated therewith are found, e.g., in U.S. Pat. No. 9,256,709, granted Feb. 9, 2016, U.S. Pre-Grant Pub. No. 20150278429, published Oct. 1, 2015, U.S. Pre-Grant Pub. No. 20140040838, published Feb. 6, 2014, and U.S. Pat. No. 7,260,442, granted Aug. 21, 2007, each of which are hereby incorporated, in their entireties, by reference.

Figure 16B:
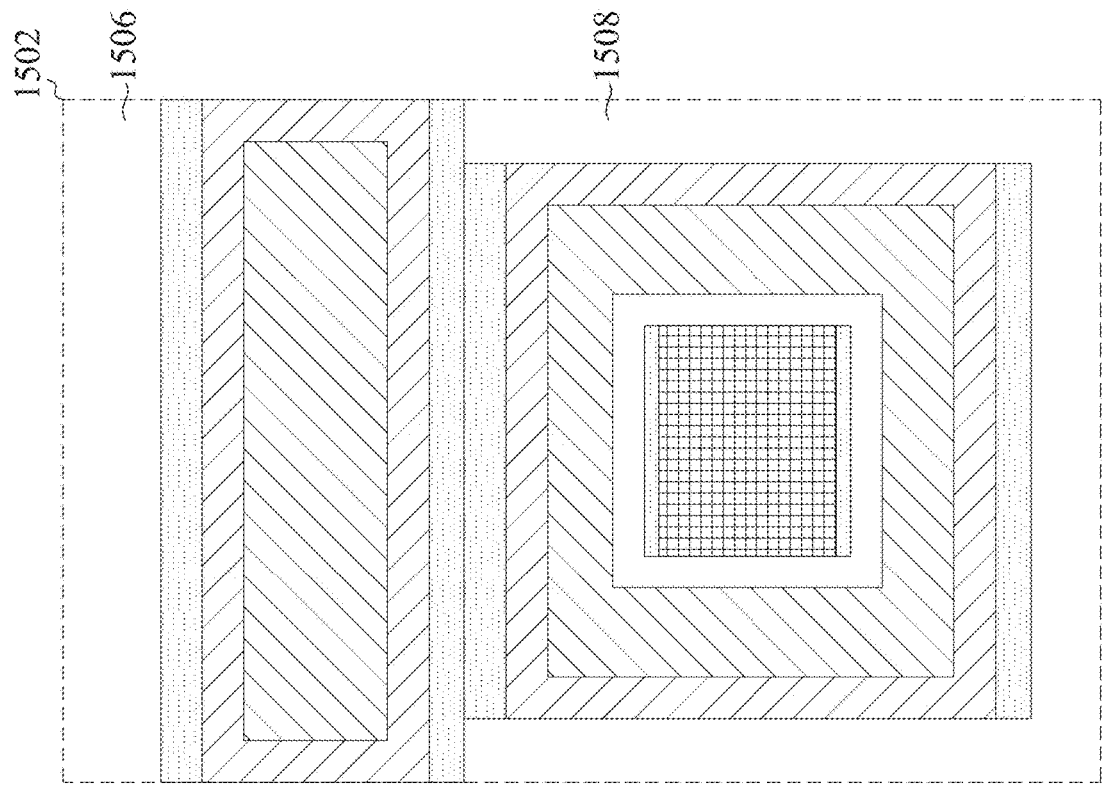
FIG. 16A is a plan view of an initial integrated circuit layout including two standard cell block regions and FIG. 16B is a plan view of an initial integrated circuit layout including two modified standard cell block regions.
Figure 16A:
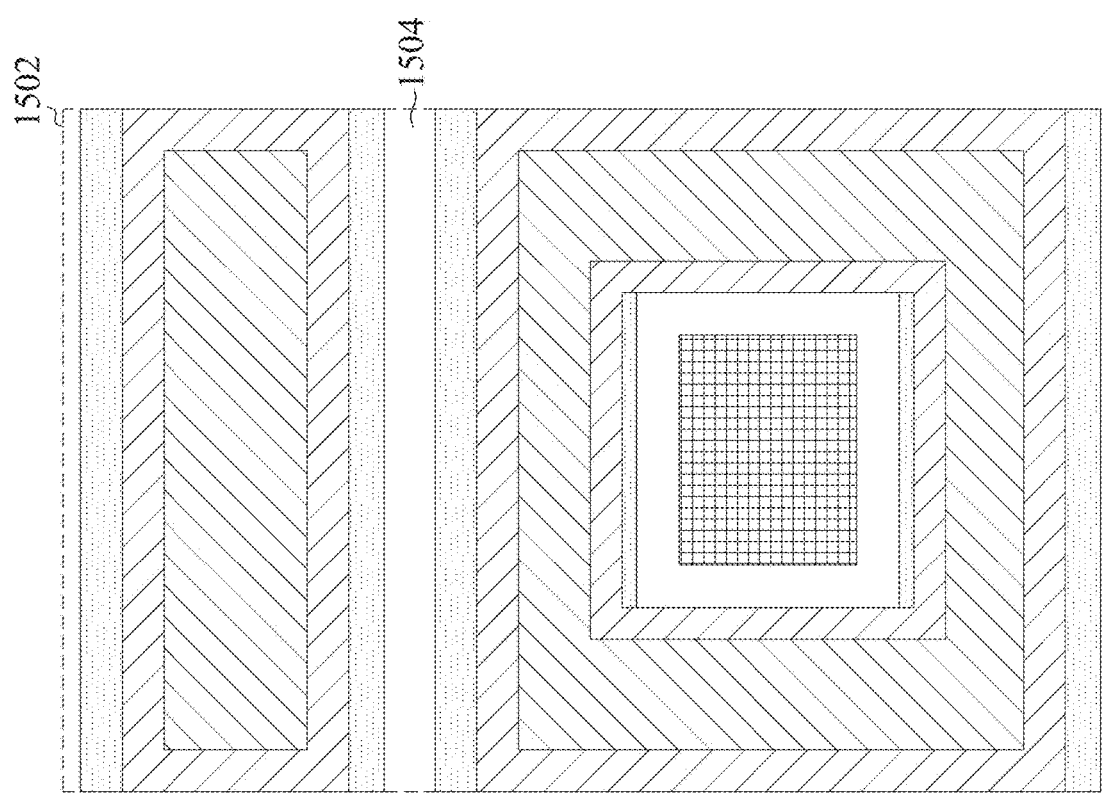

FIG. 16A is a plan view of an initial integrated circuit layout including two standard cell block regions consuming an area 1502 (dashed line) and separated by white space 1504. FIG. 16B is a plan view of a modified integrated circuit layout including two, vertically abutted modified standard cell block regions that allow the standard cells to be positioned more closely, thereby freeing up surface areas 1506, 1508, and reducing or eliminating the white space 1504 between the standard cell blocks. Some embodiments are utilized in manufacturing IC devices using processing regimes broadly referred to as N5 and N3 processes while some embodiments are used in manufacturing IC devices under less challenging process parameters.

Methods for designing semiconductor device according to some embodiments include the steps of retrieving a layout design file, searching the layout design file for a vertical abutment between a first standard cell block and second cell block, analyzing the vertical abutment between the first standard cell block and second cell block and, in response to identifying a mismatch between the first standard cell block and the second cell block, selecting a first modified cell block that reduces the mismatch, the first modified cell block including a first abutment region having a strap active region arranged along a first axis parallel to an edge of the vertical abutment; and replacing the first standard cell block with the first modified cell block to obtain a first modified layout design.

Variations of these methods include additional steps including one or more of: selecting the second cell block from a library of standard cell blocks, selecting a second modified cell block that reduces the mismatch, the second modified cell comprising a second abutment region having a strap active region along a second axis parallel to the edge of the vertical abutment and replacing the second standard cell block with the second modified cell block to obtain a second modified layout design, selecting the first modified cell block that includes a second active region arranged parallel to and inwardly from the strap active region, selecting the first modified cell block that includes a plurality of active regions arranged parallel to and inwardly from the strap active region, and/or selecting the first modified cell block that comprises a first discontinuous active region having an average active region length of $L_1$ and a second discontinuous active region arranged inwardly from the first discontinuous active region and having an average active region length of $L_2$, wherein $L_1 \neq L_2$.

Other variations of these methods include additional steps including one or more of: selecting the first modified cell block wherein at least one of the plurality of active regions is continuous, reanalyzing the vertical abutment between the first modified cell block and the second cell block and, in response to identifying a mismatch between the first modified cell block and the second cell block, selecting a second modified cell block that reduces the mismatch, the second modified cell block including a second abutment region having a continuous active region along a second axis parallel to the abutment edge and replacing the first modified cell block with the second modified cell block to obtain a second modified layout design, retrieving the first modified cell block from a cell block library, analyzing the layout design file for a horizontal abutment between the first standard cell block and a third cell block and, when a second mismatch is identified between the first standard cell block and the third cell block, incorporating a second modified cell block to reduce the second mismatch, the second modified cell block including a horizontal transition region having a plurality of conductive structures arranged perpendicular to a second axis parallel to the horizontal abutment edge, and/or selecting a first modified abutment region that reduces the mismatch, the first modified abutment region including a continuous active region along a first axis parallel to an abutment edge, and replacing the first abutment region with the first modified abutment region to obtain a first modified layout design.

Semiconductor devices according to some embodiments include the features of: a first modified cell block having a first modified abutment region, a second cell block having a second abutment region, the first modified cell block and the second cell block are arranged to form a vertical abutment, in which the first modified abutment region includes a first continuous active region along a first axis parallel to a vertical abutment edge; and in which the first modified abutment region is positioned directly adjacent the second abutment region to reduce a total device area occupied by the first modified cell block and the second cell block.

Other variations of the semiconductor devices according to some embodiments include one or more additional features of: the second cell block being a second modified cell block including a second modified abutment region having a second continuous active region along a second axis parallel to the vertical abutment edge, the first modified abutment region including a second active region arranged parallel to and inwardly from the continuous active region, the first modified abutment region comprises a first plurality of active regions arranged parallel to and inwardly from the continuous active region, the first plurality of active regions arranged parallel and including a first discontinuous active region having an average active region length of $L_1$; and a second discontinuous active region arranged inwardly from the first discontinuous active region and having an average active region length of $L_2$, the second active region is continuous, the dimensions of the first and second discontinuous active regions satisfy the expression $L_1 > L_2$, and/or a transition region arranged perpendicular to the vertical abutment edge, the transition region including a plurality of conductive elements arranged in parallel.

Semiconductor devices according to some embodiments include the features of: a first modified cell block having a first modified vertical abutment region and a first horizontal abutment region, a second cell block having a second vertical abutment region, a third cell block having a second horizontal abutment region, the first modified cell block and the second cell block are arranged to form a vertical abutment, with the first modified vertical abutment region including a continuous active region along a first axis parallel to a vertical abutment edge, with the first modified vertical abutment region being positioned directly adjacent the second vertical abutment region, thereby reducing total device area, in which the first and second horizontal abutment regions cooperate to form a combined horizontal abutment region arranged perpendicular to the vertical abutment edge, the combined horizontal abutment providing a plurality of conductive elements arranged in parallel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of designing a semiconductor device, the method comprising:
   analyzing an abutment between a first standard cell block and a second cell block and;
   in response to identifying a topographic mismatch between the first standard cell block and the second cell block:
      selecting a first modified cell block that reduces the topographic mismatch and a spacing between the first modified cell block and the second cell block, the first modified cell block comprising a first abutment region having a continuous active region arranged along a first axis parallel to an edge of the abutment; and
   replacing the first standard cell block with the first modified cell block to obtain a first modified layout design.

2. The method of designing a semiconductor device according to claim 1, further comprising:
   selecting the second cell block from a library of standard cell blocks.

3. The method of designing a semiconductor device according to claim 1, further comprising:
   selecting a second modified cell block that reduces the topographic mismatch and the spacing between the first modified cell block and the second modified cell block, the second modified cell block comprising a second abutment region having a continuous active region along a second axis parallel to the edge of the abutment; and
   replacing the second cell block with the second modified cell block to obtain a second modified layout design.

4. The method of designing a semiconductor device according to claim 1, wherein selecting the first modified cell block comprises selecting the first modified cell block that comprises a second active region arranged parallel to and inwardly from the continuous active region.

5. The method of designing a semiconductor device according to claim 1, wherein selecting the first modified cell block comprises selecting the first modified cell block that comprises a plurality of active regions arranged parallel to and inwardly from the continuous active region.

6. The method of designing a semiconductor device according to claim 5, wherein selecting the first modified cell block comprises selecting the first modified cell block that comprises:
   a first discontinuous active region having an average active region length of $L_1$; and
   a second discontinuous active region arranged inwardly from the first discontinuous active region and having an average active region length of $L_2$, wherein $L_1 \neq L_2$.

7. The method of designing a semiconductor device according to claim 5, wherein selecting the first modified cell block comprises selecting the first modified cell block wherein at least one of the plurality of active regions is continuous.

8. The method of designing a semiconductor device according to claim 1, further comprising:
   reanalyzing the abutment between the first modified cell block and the second cell block and, in response to identifying a mismatch between the first modified cell block and the second cell block:
   selecting a second modified cell block that reduces the mismatch, the second modified cell block comprising a second abutment region having a continuous active region along a second axis parallel to the abutment; and
   replacing the first modified cell block with the second modified cell block to obtain a second modified layout design.

9. The method of designing a semiconductor device according to claim 1, further comprising:

retrieving the first modified cell block from a cell block library.

10. The method of designing a semiconductor device according to claim 1, further comprising:
analyzing the layout design file for a horizontal abutment between the first standard cell block and a third cell block and, in response to identifying a second mismatch between the first standard cell block and the third cell block; and
incorporating a second modified cell block to reduce the second mismatch, wherein the second modified cell block includes a horizontal transition region having a plurality of conductive structures arranged perpendicular to a second axis parallel to the horizontal abutment.

11. The method of designing a semiconductor device according to claim 1, further comprising:
selecting a first modified abutment region that reduces the mismatch, the first modified abutment region comprising a continuous active region along a first axis parallel to an abutment edge; and
replacing the first abutment region with the first modified abutment region to obtain the first modified layout design.

12. A semiconductor device comprising:
a first modified cell block having a first modified vertical abutment region and a first modified horizontal abutment region, wherein the first modified vertical abutment region comprises a continuous active region along a first axis parallel to a vertical abutment edge;
a second cell block having a second vertical abutment region, wherein the first modified cell block and the second cell block form a vertical abutment, and the first modified vertical abutment region is positioned directly adjacent the second vertical abutment region; and
a third cell block having a second horizontal abutment region, wherein the first modified horizontal abutment region and the second horizontal abutment regions form a horizontal abutment arranged perpendicular to the vertical abutment, the horizontal abutment comprising a plurality of conductive elements arranged in parallel.

13. The semiconductor device according to claim 12, wherein:
the second cell block comprises a second modified cell block; and
the second modified cell block includes a second modified abutment region having a second continuous active region along a second axis parallel to the vertical abutment.

14. The semiconductor device according to claim 12, wherein:
the first modified vertical abutment region comprises a second active region parallel to and further from the vertical abutment than the continuous active region.

15. The semiconductor device according to claim 14, wherein:
the first modified abutment region comprises a first plurality of active regions parallel to and inward from the first continuous active region.

16. The semiconductor device according to claim 15, wherein:
each of the first plurality of active regions arranged parallel comprises:
a first discontinuous active region having an average active region length of $L_1$; and
a second discontinuous active region arranged inwardly from the first discontinuous active region and having an average active region length of $L_2$.

17. The semiconductor device according to claim 14, wherein:
the second active region is continuous.

18. The semiconductor device according to claim 16, wherein:
$L_1 > L_2$.

19. The semiconductor device according to claim 12, further comprising:
a transition region perpendicular to the vertical abutment edge, the transition region comprising a plurality of conductive elements parallel to one another.

20. A semiconductor device comprising:
a first modified cell block having a first modified vertical abutment region and a first modified horizontal abutment region,
wherein the first modified vertical abutment region comprises a continuous active region along a first axis parallel to a vertical abutment edge; and
wherein the first modified horizontal abutment region comprises a continuous active region along a second axis parallel to a horizontal abutment edge;
a second cell block having a second vertical abutment region,
wherein the first modified cell block and the second cell block are arranged to form a vertical abutment, and
wherein the first modified vertical abutment region is positioned directly adjacent the second vertical abutment region, thereby reducing a total device area by a first area; and
a third cell block having a second modified horizontal abutment region;
wherein the first modified horizontal abutment region is positioned directly adjacent the second modified horizontal abutment region, thereby further reducing the total device area by a second area; and
wherein the first modified horizontal abutment region and first horizontal abutment regions cooperate to form a combined horizontal abutment arranged perpendicular to the vertical abutment edge.

* * * * *